(12) United States Patent
Nummer

(10) Patent No.: US 10,177,751 B2
(45) Date of Patent: Jan. 8, 2019

(54) DELAY LINE WITH SHORT RECOVERY TIME

(71) Applicant: TAIWAN SEMICONDUCTOR MANUFACTURING COMPANY, LTD., Hsinchu (TW)

(72) Inventor: Muhammad Nummer, Ottawa (CA)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/419,009

(22) Filed: Jan. 30, 2017

(65) Prior Publication Data

US 2017/0346467 A1 Nov. 30, 2017

Related U.S. Application Data

(60) Provisional application No. 62/342,609, filed on May 27, 2016.

(51) Int. Cl.
*H03K 5/15* (2006.01)
*H03K 5/131* (2014.01)
*H03K 5/00* (2006.01)

(52) U.S. Cl.
CPC ......... *H03K 5/15046* (2013.01); *H03K 5/131* (2013.01); *H03K 5/15* (2013.01); *H03K 5/1508* (2013.01); *H03K 2005/00234* (2013.01)

(58) Field of Classification Search
CPC .. H03K 5/15046; H03K 5/1508; H03K 5/131; H03K 5/1504
See application file for complete search history.

(56) References Cited

U.S. PATENT DOCUMENTS

| 5,867,432 | A | * | 2/1999 | Toda | G11C 7/22 327/276 |
|---|---|---|---|---|---|
| 6,292,412 | B1 | * | 9/2001 | Kato | G11C 7/22 365/194 |
| 6,388,484 | B1 | * | 5/2002 | Kamoshida | H03K 5/135 327/161 |
| 2003/0122598 | A1 | * | 7/2003 | Kim | H03L 7/0814 327/158 |
| 2006/0261869 | A1 | * | 11/2006 | Gomm | H03L 7/0812 327/158 |
| 2009/0201060 | A1 | * | 8/2009 | Ho | H03K 5/06 327/161 |
| 2009/0309638 | A1 | * | 12/2009 | Delage | H03K 3/0322 327/158 |

(Continued)

*Primary Examiner* — Thomas J. Hiltunen
(74) *Attorney, Agent, or Firm* — Hauptman Ham, LLP

(57) ABSTRACT

A delay circuit includes a plurality of cascaded delay elements responsive to control signals. Each delay element is configurable to receive an input signal on a forward path and return the input signal on two return paths. A control unit is connected to the plurality of cascaded delay elements and configured to generate a first set of control signals for defining a first configuration of the plurality of cascaded delay elements, a second set of control signals for causing a delay element of the plurality of cascaded delay elements to change from a powered off status to a powered on status while configured in an initialization mode, and a third set of control signals for defining a second configuration of the plurality of cascaded delay elements.

20 Claims, 13 Drawing Sheets

(56) References Cited

U.S. PATENT DOCUMENTS

| | | | | |
|---|---|---|---|---|
| 2013/0193986 A1* | 8/2013 | Willey | ............. | G11C 29/023 |
| | | | | 324/617 |
| 2014/0152365 A1* | 6/2014 | Ma | ............. | H03L 7/08 |
| | | | | 327/277 |
| 2015/0357017 A1* | 12/2015 | Diffenderfer | ....... | G11C 11/4076 |
| | | | | 365/194 |

* cited by examiner

500

502 — Receive, by a control unit, a first delay code.

504 — Generate, by the control unit, a first set of control signals.

506 — Based on the first set of control signals, a plurality of cascaded delay elements is set in a first configuration to receive an input signal on a forward path and return the input signal on two return paths.

508 — Propagate a first input signal on the forward path and a return path of the two return paths.

510 — Receive, by the control unit, a second delay code

512 — Generate, by the control unit, a second set of control signals.

514 — Based on the second set of control signals, initialize a delay element of the plurality of cascaded delay elements by powering on the delay element, grounding a forward path output, configuring a first return path output to receive a first forward path input signal, and configuring a second return path output to receive a second forward path input signal 516 — Generate, by the control unit, a third set of control signals.

518 — Based on the third set of control signals, configure the plurality of cascaded delay elements in a second configuration 520 — Propagate a second input signal on the forward path and the return path of the two return paths

Fig. 5

DELAY LINE WITH SHORT RECOVERY TIME

BACKGROUND

Delay lines, including lattice delay lines (LDL) provide defined delays for an input signal routed through cascaded delay elements. Lattice delay lines are implemented using delay elements configurable via control signals to allow the input signal to pass to the next delay element or direct the input signal to a return path. For a given delay, a predetermined number of cascaded delay elements provides the forward path and a return path for the input signal. Beyond a point in the cascade at which the input signal is returned, the series of delay elements are unused.

In some approaches, unused delay elements are powered off to reduce leakage current levels. Leakage current is a concern in delay element implementations using low threshold voltage devices. Reconfiguring a delay line for an increased delay includes powering on one or more delay elements that were previously powered off. A recovery time is used to allow the delay element to reach a controlled state prior to routing an input signal through the delay line.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a flow chart of a method of powering on a delay element of a plurality of cascaded delay elements, in accordance with some embodiments.

DETAILED DESCRIPTION

Figure 1:
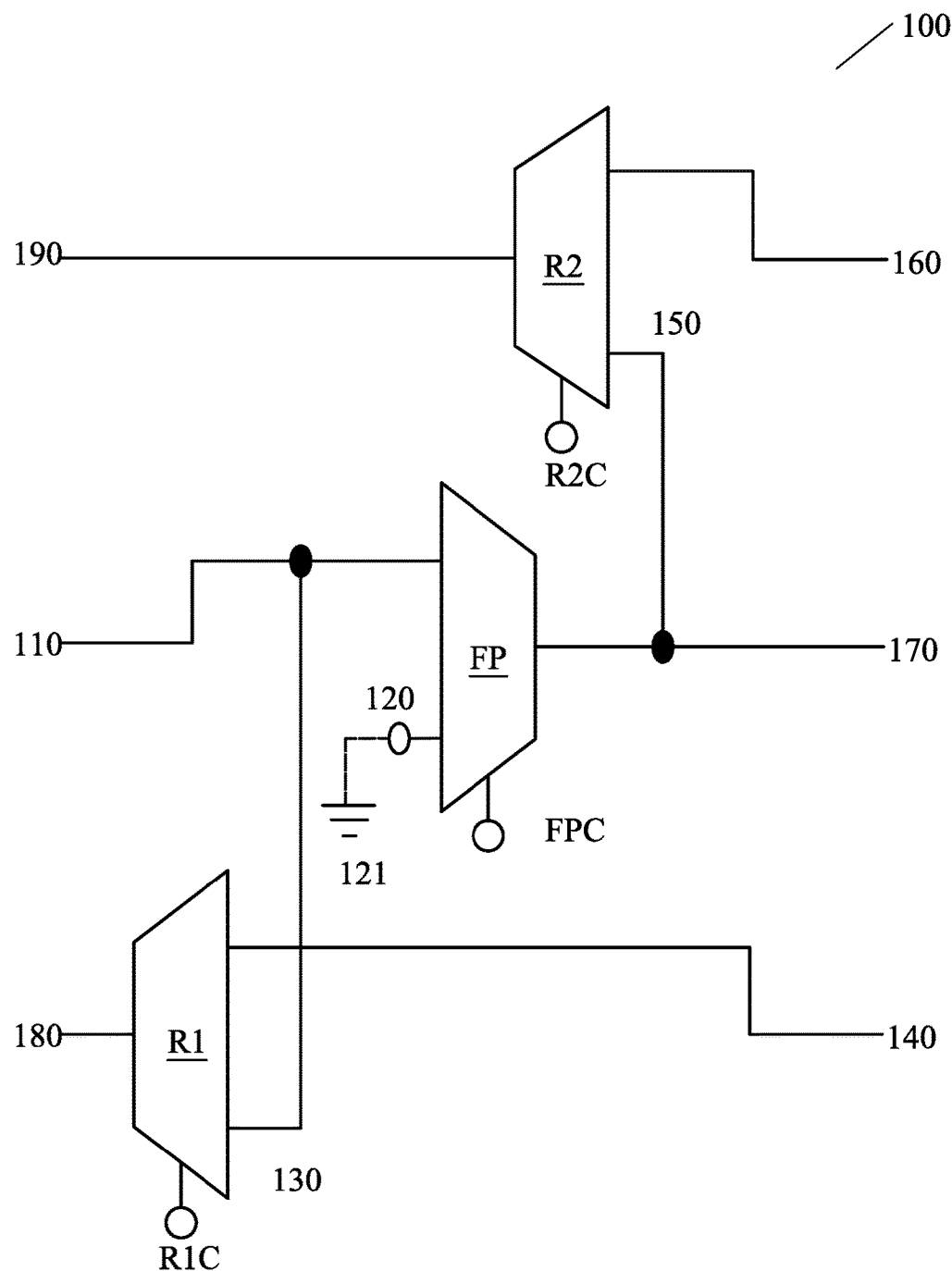
FIG. 1 is a schematic diagram of a delay element for a lattice delay line, in accordance with some embodiments.

The following disclosure provides different embodiments, or examples, for implementing features of the provided subject matter. Specific examples of components and arrangements are described below to simplify the present disclosure. These are, of course, merely examples and are not limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A control unit of a delay line such as a lattice delay line (LDL) powers on delay elements in a two-step process. In the first step, power is applied to the delay elements while the delay elements are in an initialization mode for providing a grounded input and a signal return configuration. In this initialization mode, each path within a delay element has a local ground connection and quickly reaches a known state. In the second step, the delay elements are configured for a new delay setting. Because each step is applied to all recently powered on delay elements in parallel, recovery time for a new configuration is shorter and the delay line is more quickly available for use in comparison with delay lines which use different approaches.

FIG. 1 is a schematic diagram of a delay element 100 for a delay line, in accordance with some embodiments. Delay element 100 is usable as a delay element 310 of a delay line 300, described below with respect to FIGS. 3A-3C. Delay element 100 includes a forward path multiplexer FP configured to receive a control signal at a control signal port FPC. A first return path multiplexer R1 is configured to receive a control signal at a control signal port R1C. A second return path multiplexer R2 is configured to receive a control signal at a control signal port R2C. Forward path multiplexer FP is configured to receive a first input signal at an input port 110 and a second input signal at an input port 120. First return path multiplexer R1 is configured to receive a first input signal at an input port 130 and a second input signal at an input port 140. Second return path multiplexer R2 is configured to receive a first input signal at an input port 150 and a second input signal at an input port 160. Input port 110 of forward path multiplexer FP is connected to input port 130 of first return path multiplexer R1 and is thereby configured to receive a same input signal as the input signal received at input port 130.

Forward path multiplexer FP is configured to output an output signal from an output port 170. Output port 170 is also connected to input port 150 of second return path multiplexer R2. First return path multiplexer R1 is configured to output an output signal from output port 180. Second return path multiplexer R2 is configured to output an output signal from output port 190. In some embodiments, input port 120 is connected to a ground reference 121.

In some embodiments, delay element 100 is a delay element of a plurality of cascaded delay elements 100 of a delay line in which input port 110, output port 180, and output port 190 are connected to an output port 170, input port 140, and input port 160, respectively, of an adjacent delay element 100 of the plurality of cascaded delay elements 100. In such embodiments, and with the adjacent delay element 100 being to the left of delay element 100, input port 110 is thereby configured to receive an output signal from output port 170 of the adjacent delay element 100, output port 180 is thereby configured to output an output signal to input port 140 of the adjacent delay element 100, and output port 190 is thereby configured to output an output signal to input port 160 of the adjacent delay element 100.

In some embodiments, delay element 100 is a delay element of a plurality of cascaded delay elements 100 of a delay line in which output port 170, input port 140, and input port 160 are connected to an input port 110, output port 180, and output port 190, respectively, of an adjacent delay element 100 of the plurality of cascaded delay elements 100. In such embodiments and with the adjacent delay element being to the right of delay element 100, output port 170 is thereby configured to output an output signal to input port 110 of the adjacent delay element 100, input port 140 is thereby configured to receive an output signal from output port 180 of the adjacent delay element 100, and input port 160 is thereby configured to receive an output signal from output port 190 of the adjacent delay element 100.

In some embodiments, delay element 100 is a first one of a plurality of cascaded delay elements 100 of a delay line and input port 110 is connected to an input port of the delay line. In such embodiments, input port 110 is thereby configured to receive an input signal output from a source external to the delay line.

In some embodiments, delay element 100 is a first one of a plurality of cascaded delay elements 100 of a delay line and output port 180 is connected to an output port of the delay line. In such embodiments, output port 180 is thereby configured to output an output signal from the output port of the delay line.

In some embodiments, delay element 100 is a first one of a plurality of cascaded delay elements 100 of a delay line and output port 190 is connected to an output port of the delay line. In such embodiments, output port 190 is thereby configured to output an output signal from the output port of the delay line.

Input port 120 is configured to receive a voltage reference signal. In some embodiments, the voltage reference signal is ground reference 121, also known as a static zero reference. In some embodiments, delay element 100 is one of a plurality of cascaded delay elements 100 of a delay line and each delay element 100 includes input port 120 configured to receive the ground reference 121.

Forward path multiplexer FP is configured to switch between input port 110 and input port 120 and provide the signal at the selected input port as the output signal at output port 170. Forward path multiplexer FP is configured to, in operation, respond to the control signal received at control signal port FPC by outputting the signal received at either input port 110 or input port 120 from output port 170.

First return path multiplexer R1 is configured to switch between input port 130 and input port 140 and provide the signal at the selected input port as the output signal at output port 180. First return path multiplexer R1 is configured to, in operation, respond to the control signal received at control signal port R1C by outputting an input signal received at either input port 130 or input port 140 from output port 180.

Second return path multiplexer R2 is configured to switch between input port 150 and input port 160 and provide the signal at the selected input as the output signal on output port 190. Second return path multiplexer R2 is configured to, in operation, respond to the control signal received at control signal port R2C by outputting an input signal received at either input port 150 or input port 160 from output port 190.

Delay element 100 is configured so that, in operation, an input signal that propagates along a signal path experiences a predetermined delay based on the presence of one or two of forward path multiplexer FP, first return path multiplexer R1, and second return path multiplexer R2 in the signal path. Each one of forward path multiplexer FP, first return path multiplexer R1, and second return path multiplexer R2 has a same predetermined delay length, so a total length of the predetermined delay is a function of the specific signal path as determined by the configuration of delay element 100.

With forward path multiplexer FP configured to select a signal received at input port 110 and output the signal from output port 170, the signal, in operation, propagates along a forward path through delay element 100 with a predetermined delay length associated with forward path multiplexer FP.

With first return path multiplexer R1 configured to select a signal received at input port 140 and output the signal from output port 180, the signal, in operation, propagates along a direct return path through delay element 100 with a predetermined delay length associated with first return path multiplexer R1. With first return path multiplexer R1 configured to select a signal received at input port 130 and output the signal from output port 180, the signal, in operation, propagates along a first return path of delay element 100 with a predetermined delay length associated with first return path multiplexer R1.

With second return path multiplexer R2 configured to select a signal received at input port 160 and output the signal from output port 190, the signal, in operation, propagates along a direct return path through delay element 100 with a predetermined delay length associated with second return path multiplexer R2. With forward path multiplexer FP configured to select a signal received at input port 110 and output the signal from output port 170, and with second return path multiplexer R2 configured to select a signal received at input port 150 (the output signal output from output port 170), and output the signal from output port 190, the signal, in operation, propagates along a second return path of delay element 100 with a total predetermined delay length that is the sum of the predetermined delay length associated with forward path multiplexer FP and the predetermined delay length associated with second return path multiplexer R2. Because, in some embodiments, forward path multiplexer PF and second return path multiplexer R2 have a same predetermined delay length, the total predetermined delay length associated with this signal path configuration is double the predetermined delay length associated with other signal path configurations.

In some embodiments, delay element 100 is one of a plurality of cascaded delay elements 100 of a delay line and a subset of the plurality of cascaded delays elements 100 is configured so that, in operation, an input signal propagates along each forward path multiplexer FP of the subset of the plurality of cascaded delay elements until being returned along a first return path and a second return path. In such embodiments, a total predetermined delay length for each returned signal is based on a total number of forward path multiplexers FP and return path multiplexers R1 or R2 in the complete path of the returned signal, as determined by the programmed state of each delay element 100 of the plurality of cascaded delay elements 100 of the delay line.

FIGS. 2A-2E are schematic diagrams of delay element 100 including signal paths, in accordance with some embodiments. In FIGS. 2A-2E, control signal ports FPC, R1C, and R2C of delay element 100 are omitted for simplicity.

Figure 2A:
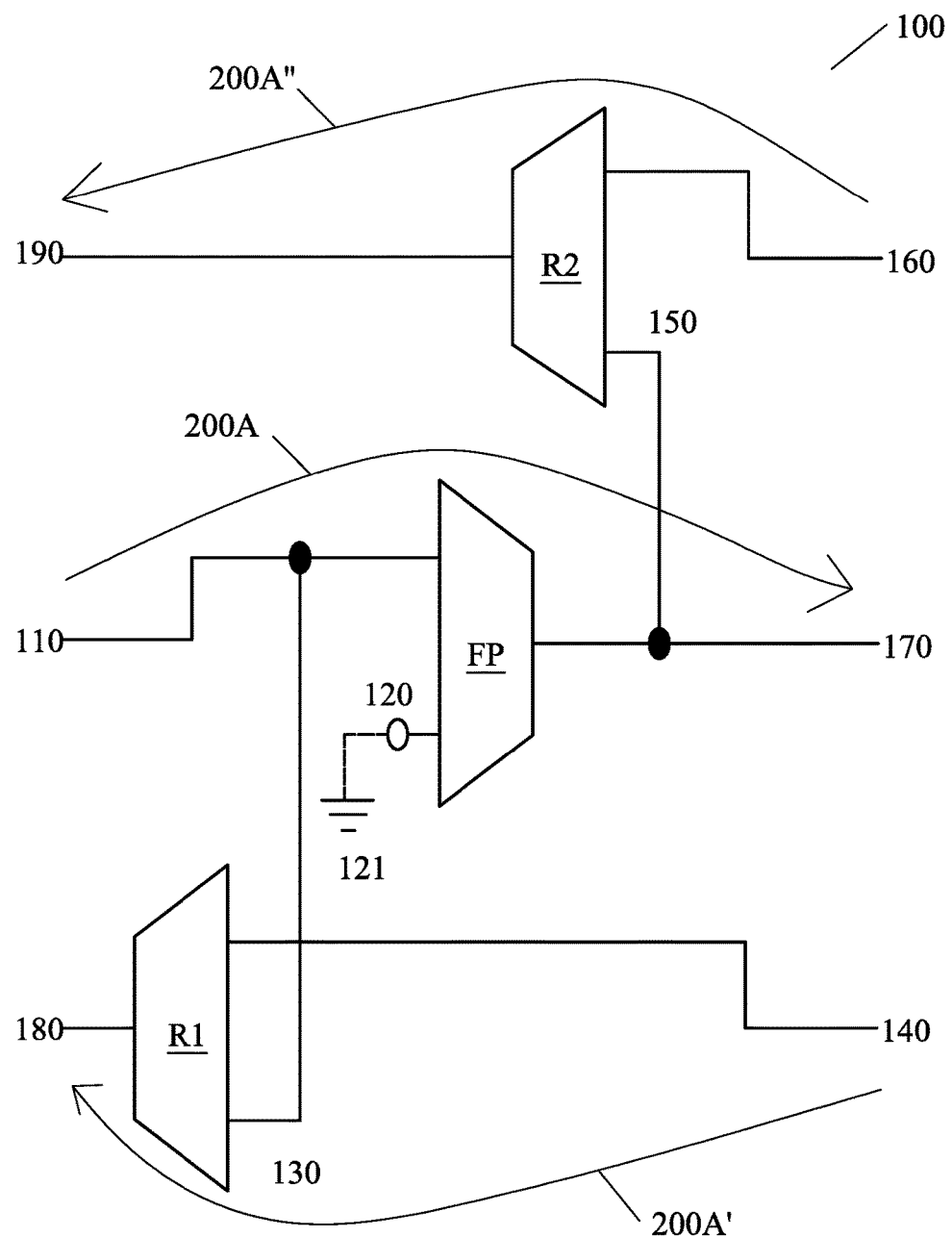
FIGS. 2A-2E are schematic diagrams of a delay element for a delay line including signal paths, in accordance with some embodiments.

FIG. 2A includes a configuration in which forward path multiplexer FP of delay element 100 is configured to select an input signal at input port 110 for output from output port 170, first return multiplexer R1 is configured to select an input signal at input port 140 for output from output port 180, and second return multiplexer R2 is configured to select an input signal at input port 160 for output from output port 190.

As indicated by the signal path 200A, in operation, an input signal received at input port 110 is output from output port 170. As indicated by the signal path 200A', in operation, an input signal received at input port 140 is output from output port 180. As indicated by the signal path 200A", in operation, an input signal received at input port 160 is output from output port 190.

In some embodiments, delay element 100 is one of a plurality of cascaded delay elements 100 of a delay line and the configuration of FIG. 2A is an example of a direct mode in which signal path 200A is part of a forward path of the delay line, signal path 200A' is part of a first return path of the delay line, and signal path 200A" is part of a second return path of the delay line.

Figure 2B:
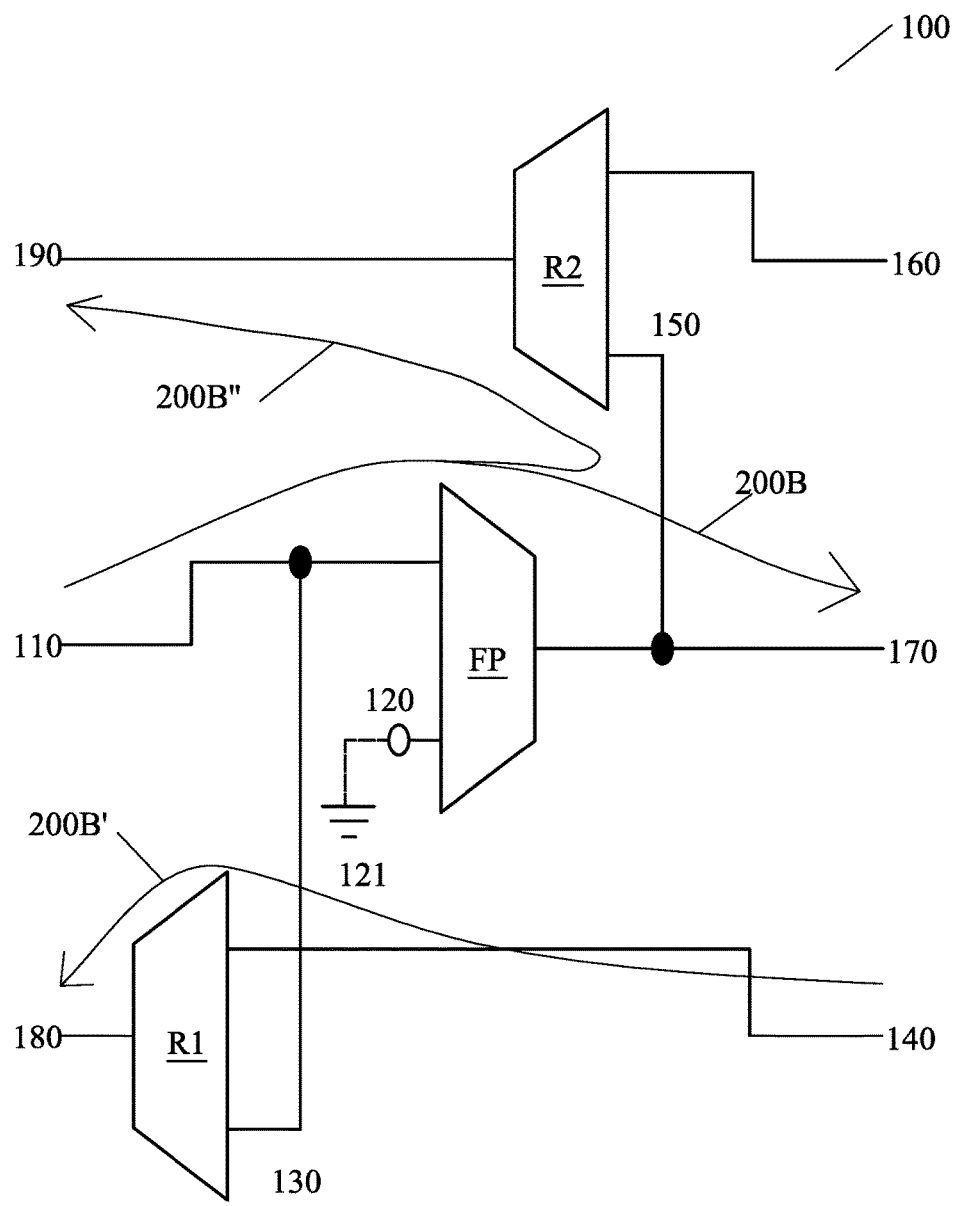

FIG. 2B includes a configuration in which forward path multiplexer FP of delay element 100 is configured to select an input signal at input port 110 for output from output port 170, first return multiplexer R1 is configured to select an input signal at input port 140 for output from output port 180, and second return multiplexer R2 is configured to select an input signal at input port 150 for output from output port 190.

As indicated by the signal path 200B, in operation, an input signal received at input port 110 is output from output port 170. As indicated by the signal path 200B', in operation, an input signal received at input port 140 is output from output port 180. Because input port 150 is connected to output port 170, the signal received at input port 110 and output from output port 170 is output from output port 190, in operation. As indicated by the signal path 200B", in operation, an input signal received at input port 150 is output from output port 190.

In some embodiments, delay element 100 is one of a plurality of cascaded delay elements 100 of a delay line and the configuration of FIG. 2B is an example of a second return mode in which signal path 200B is part of a forward path of the delay line, signal path 200B' is part of a first return path of the delay line, signal path 200B" is a path connecting the forward path to the second return path of the delay line, and input port 160 is isolated from the second return path.

Figure 2C:
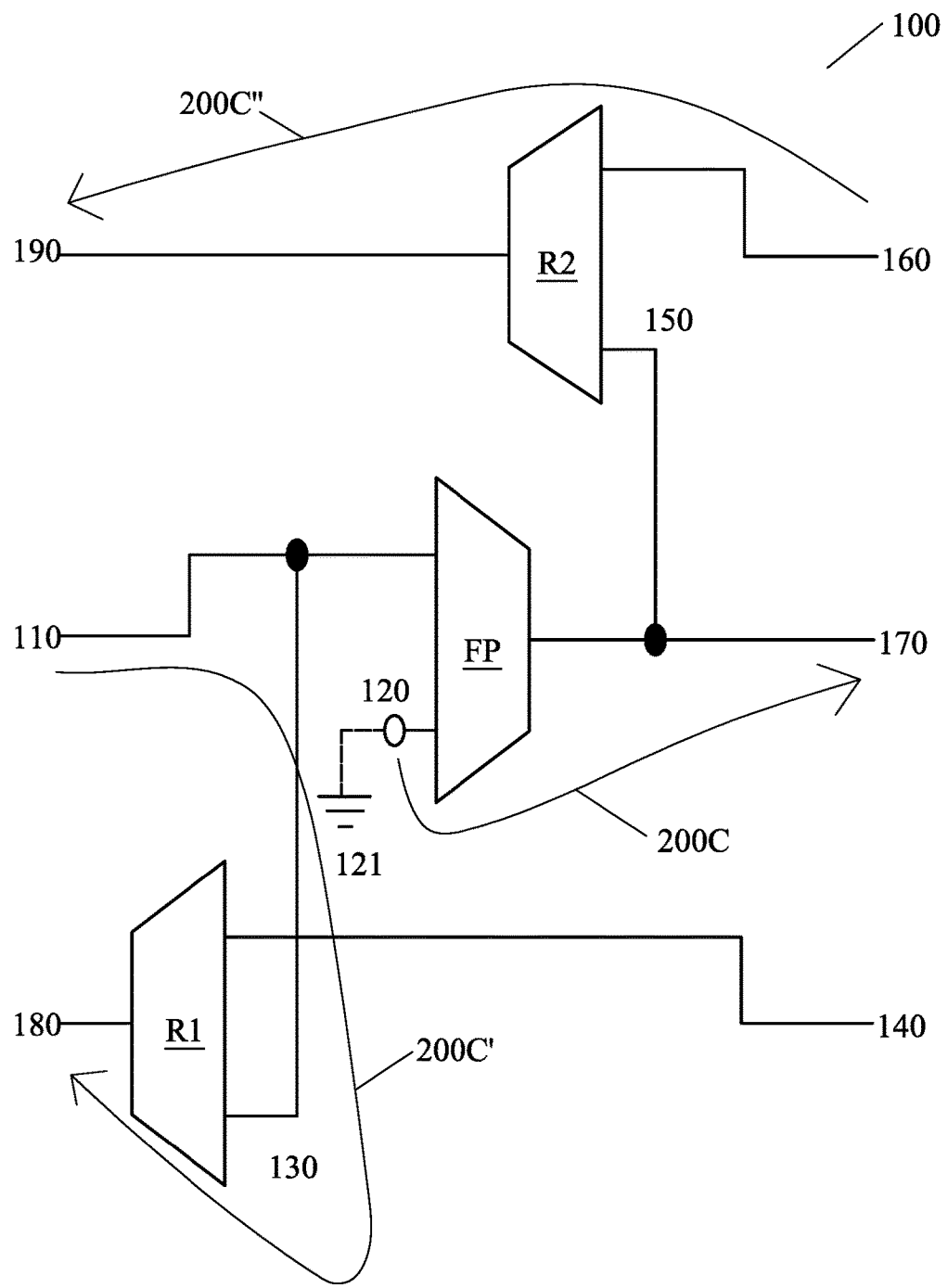

FIG. 2C includes a configuration in which forward path multiplexer FP of delay element 100 is configured to select an input signal at input port 120 for output from output port 170, first return multiplexer R1 is configured to select an input signal at input port 130 for output from output port 180, and second return multiplexer R2 is configured to select an input signal at input port 160 for output from output port 190. In some embodiments, the input signal at input port 120 is a voltage reference signal. In some embodiments, input port 120 is connected to ground reference 121 and the input signal at input port 120 is a ground reference signal.

As indicated by the signal path 200C, in operation, an input signal received at input port 120 is output from output port 170. As indicated by the signal path 200C', in operation, an input signal received at input port 130 is output from output port 180. As indicated by the signal path 200C", in operation, an input signal received at input port 160 is output from output port 190. Because input port 130 is connected to input port 110, the signal received at input port 110 is received at input port 130, in operation.

In some embodiments, delay element 100 is one of a plurality of cascaded delay elements 100 of a delay line and the configuration of FIG. 2C is an example of a first return mode in which signal path 200C is isolated from a forward path of the delay line, signal path 200C' is a path connecting the forward path of the delay line to a first return path of the delay line, input port 140 is isolated from the first return path of the delay line, and signal path 200C" is isolated from a second return path of the delay line by an adjacent delay element 100 to the left of delay element 100.

In some embodiments, delay element 100 having the configuration of FIG. 2C is an nth delay element 100 of a plurality of cascaded delay elements 100 of a delay line, and an adjacent (n−1)th delay element 100 of the plurality of cascaded delay elements 100 is to the left of nth delay element 100 and has the configuration of FIG. 2B, thereby isolating signal path 200C" from a second return path of the delay line. In such embodiments, signal path 200B" of the (n−1)th delay element 100 having the configuration of FIG. 2B connects the forward path of the delay line to the second return path of the delay line, and signal path 200C' of nth delay element 100 having the configuration of FIG. 2C connects the forward path of the delay line to the first return path of the delay line. In such embodiments, all other delay elements 100 to the left of the (n−1)th delay element 100, i.e. 1st through (n−2)th delay elements 100, have the configuration of FIG. 2A, and all other delay elements to the right of the nth delay element 100 have the configuration of FIG. 2E.

Figure 2D:
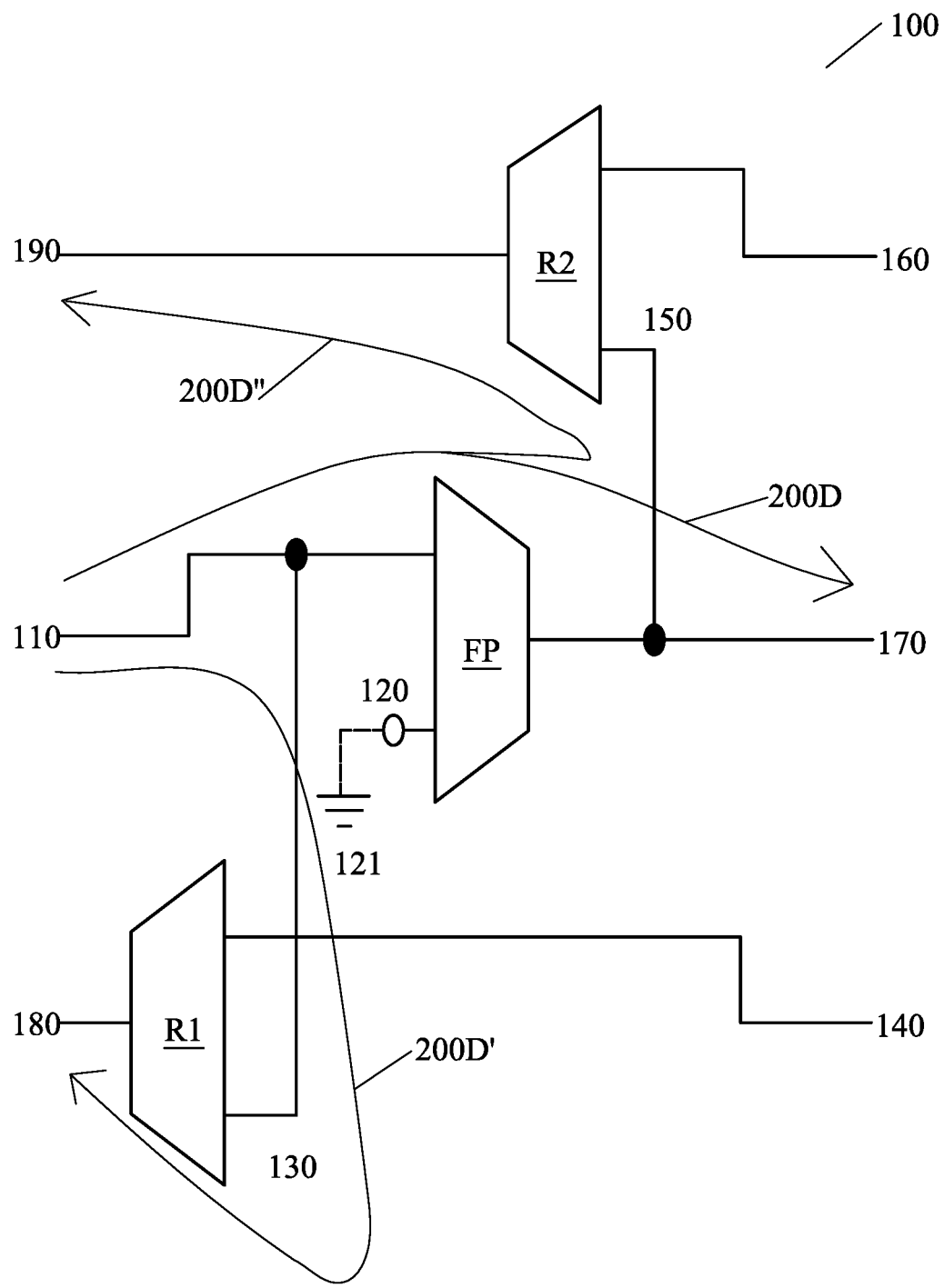

FIG. 2D includes a configuration in which forward path multiplexer FP of delay element 100 is configured to select an input signal at input port 110 for output from output port 170, first return multiplexer R1 is configured to select an input signal at input port 130 for output from output port 180, and second return multiplexer R2 is configured to select an input signal at input port 150 for output from output port 190.

As indicated by the signal path 200D, in operation, an input signal received at input port 110 is output from output port 170. As indicated by the signal path 200D', in operation, an input signal received at input port 130 is output from output port 180. Because input port 130 is connected to input port 110, the signal received at input port 110 is received at input port 130, in operation. As indicated by the signal path 200D", in operation, an input signal received at input port 150 is output from output port 190. Because input port 150 is connected to output port 170, the signal received at input port 110 and output from output port 170 is output from output port 190, in operation.

In some embodiments, delay element 100 is one of a plurality of cascaded delay elements 100 of a delay line and the configuration of FIG. 2D is an example of a full return mode in which signal path 200D' is a path connecting a forward path of the delay line to a first return path of the delay line, input port 140 is isolated from the first return path of the delay line, signal path 200D" is a path connecting the forward path of the delay line to a second return path of the delay line, and input port 160 is isolated from the second return path of the delay line.

Figure 2E:
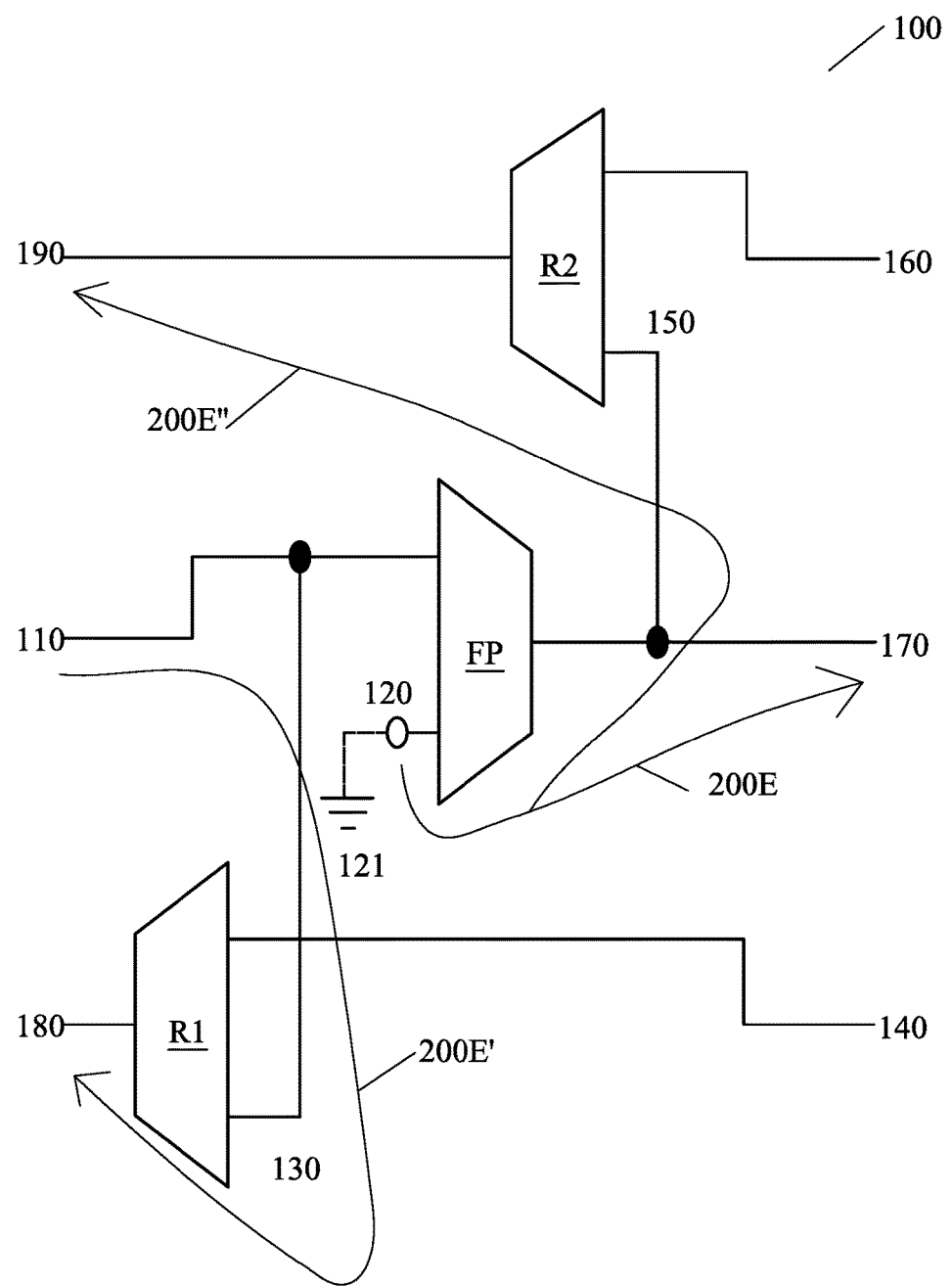

In some embodiments, delay element 100 having the configuration of FIG. 2D is one of a plurality of cascaded delay elements 100 of a delay line in which an adjacent delay element 100 to the right of delay element 100 has a configuration, e.g., the configuration of FIG. 2E, in which forward path multiplexer FP is configured to select input port 120, thereby isolating a forward path of the delay line from a further adjacent delay element 100 to the right of adjacent delay element 100. In such embodiments, all other delay elements 100 to the left of the delay element 100 have the configuration of FIG. 2A, and all other delay elements 100 to the right of the delay element 100 have the configuration of FIG. 2E.

FIG. 2E includes a configuration in which forward path multiplexer FP of delay element 100 is configured to select an input signal at input port 120 for output from output port 170, first return path multiplexer R1 is configured to select an input signal at input port 130 for output from output port 180, and second return path multiplexer R2 is configured to select an input signal at input port 150 for output from output port 190. In some embodiments, the input signal at input port 120 is a voltage reference signal. In some embodiments, input port 120 is connected to ground reference 121 and the input signal at input port 120 is a ground reference signal.

As indicated by the signal path 200E, in operation, an input signal received at input port 120 is output from output port 170. As indicated by the signal path 200E', in operation, an input signal received at input port 130 is output from output port 180. Because input port 130 is connected to input port 110, the signal received at input port 110 is received at input port 130, in operation. As indicated by the signal path 200E", in operation, an input signal received at input port 150 is output from output port 190. Because input port 150 is connected to output port 170, the signal received at input port 120 and output from output port 170 is output from output port 190, in operation. In some embodiments, in operation, the signal received at input port 120, output from output port 170, and output from output port 190 is a ground reference signal.

In some embodiments, the configuration of FIG. 2E in which input port 120 is connected to ground reference 121 is an example of a grounded input mode and a full return mode, also referred to as an initialization mode.

In operation, in some embodiments, delay element 100 having the configuration of FIG. 2E causes output port 170 to be driven to a ground reference signal through input port 120, and output port 190 to be driven to the ground reference signal through input ports 120 and 150. In operation, in some embodiments, delay element 100 having the configuration of FIG. 2E causes output port 170 to be driven to a voltage reference signal through input port 120, and output port 190 to be driven to the voltage reference signal through input ports 120 and 150.

In some embodiments, delay element 100 having the configuration of FIG. 2E is one of a plurality of cascaded delay elements 100 of a delay line and an adjacent delay element 100 to the left of delay element also has the configuration of FIG. 2E. In such embodiments, in operation, output port 180 of delay element 100 is driven to the ground or voltage reference signal through input port 130 of delay element 100 and output port 170 of the adjacent delay element 100.

In some embodiments, delay element 100 having the configuration of FIG. 2E is one of a plurality of cascaded delay elements 100 of a delay line in which output port 170 is isolated from a forward path of the delay line, input port 140 is isolated from a first return path of the delay line, and input port 160 is isolated from a second return path of the delay line.

Figure 3A:
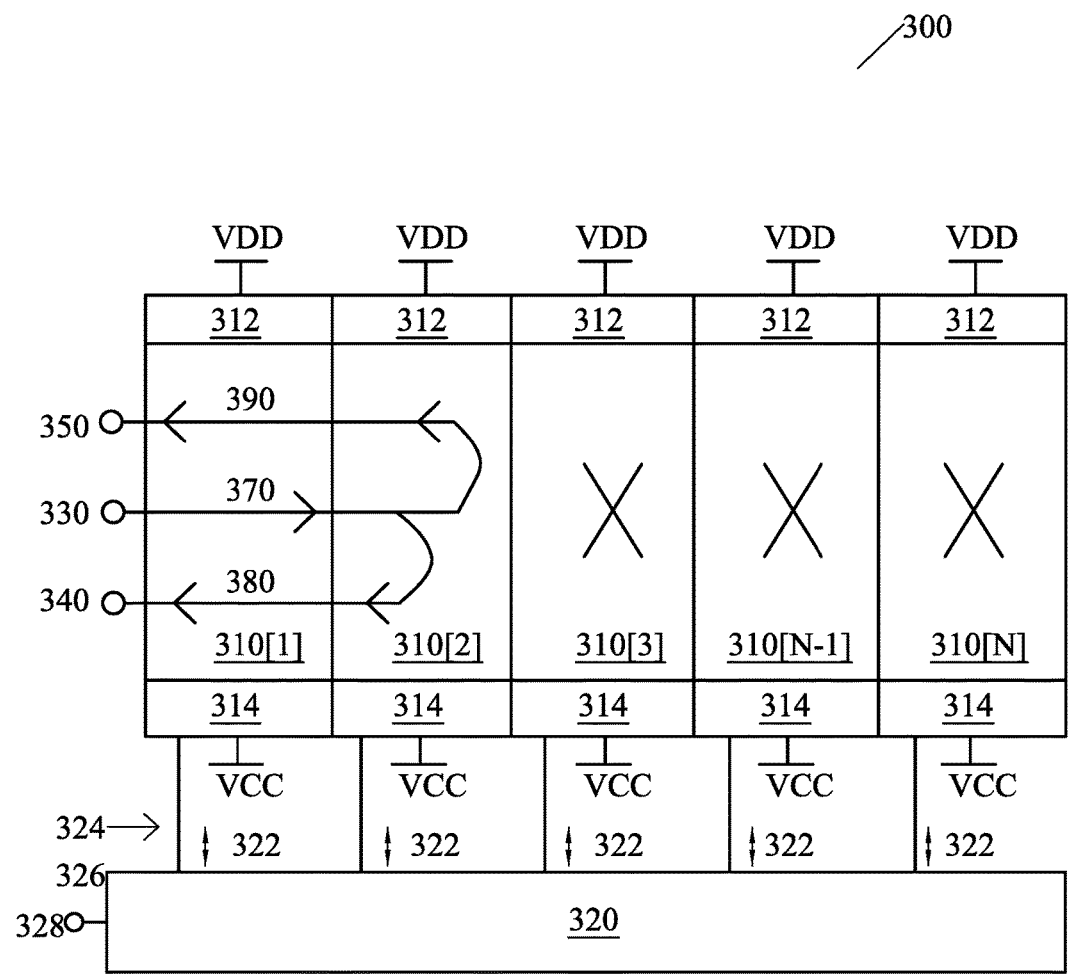
FIGS. 3A-3C are block diagrams of example configurations of a delay line, in accordance with some embodiments.
Figure 3B:
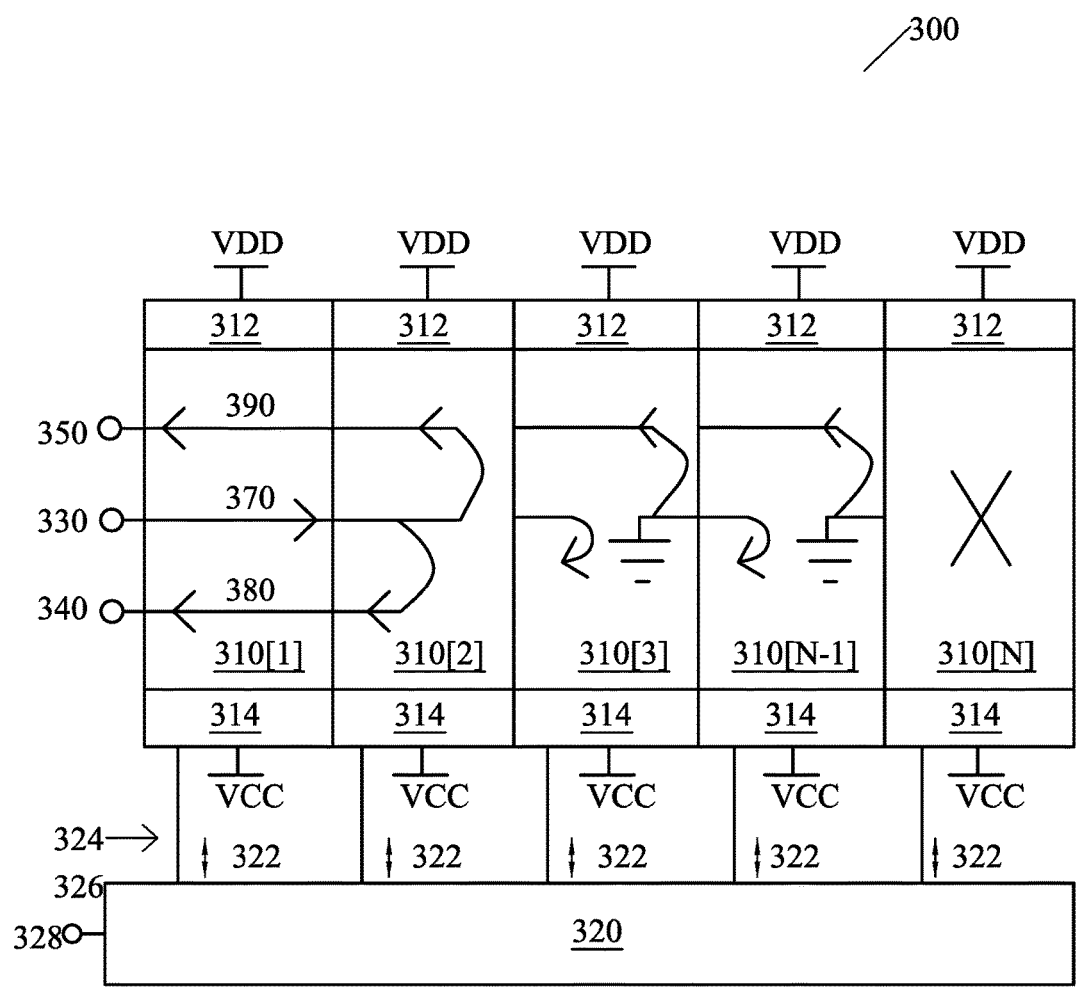
Figure 3C:
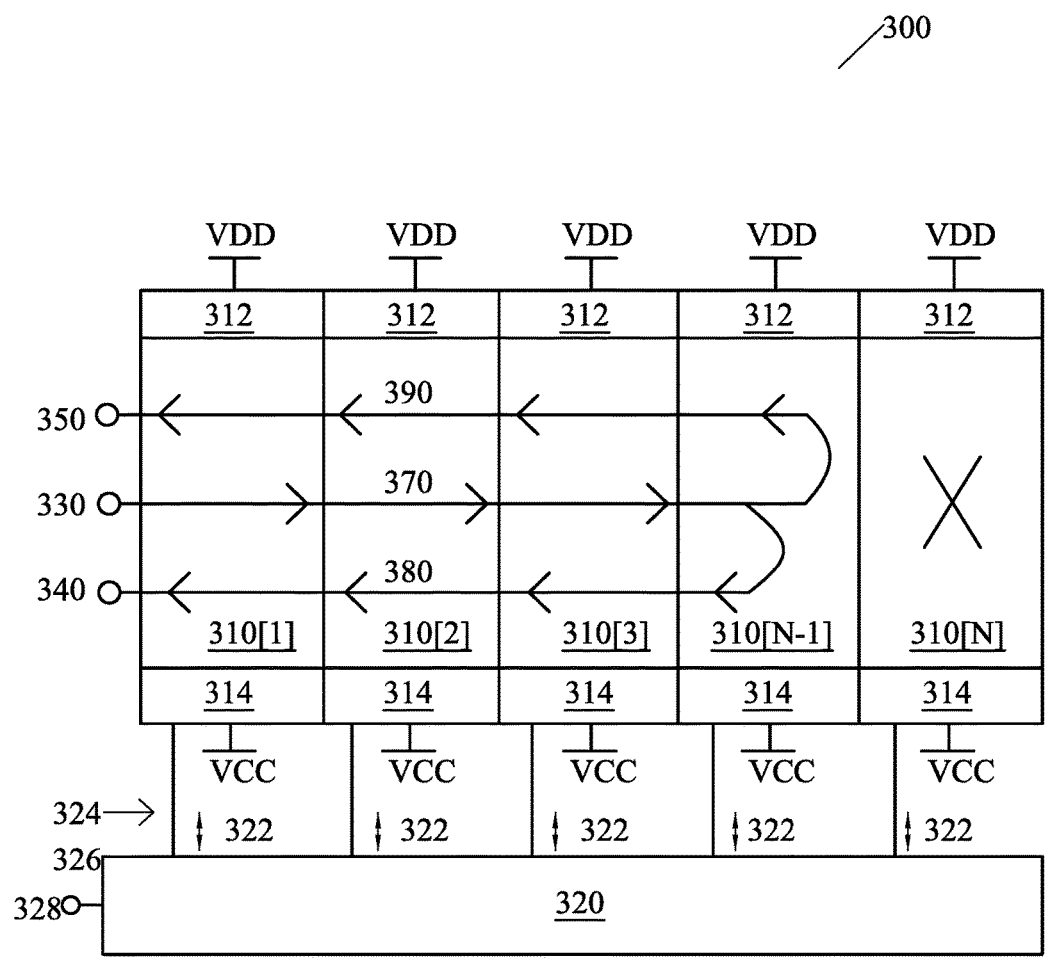

FIGS. 3A-3C are block diagrams of example configurations of a delay line 300, in accordance with some embodiments. In various embodiments, delay line 300 is referred to as a lattice delay line (LDL) and/or a digitally controlled delay line (DCDL). FIG. 3A depicts delay line 300 having a first example configuration, FIG. 3B depicts delay line 300 having a second example configuration, and FIG. 3C depicts delay line 300 having a third example configuration.

Delay line 300 includes a plurality of cascaded delay elements 310[1] to 310 [N], where N is a positive integer, collectively referred to as delay elements 310. In some embodiments, at least one cascaded delay element 310 has the structure of delay element 100, described above with respect to FIGS. 1 and 2A-2E. In some embodiments, each cascaded delay element 310 has the structure of delay element 100. A control unit 320 is configured to provide control signals 322 to components of delay line 300. A delay line input 330 is configured to supply an input signal to delay element 310[1]. A first delay line output 340 is configured to receive a first output from delay element 310[1]. A second delay line output 350 is configured to receive a second output from delay element 310[1]. While the arrangement of FIGS. 3A-3C includes five delay elements 310, some embodiments include greater or fewer than five delay elements 310. In some embodiments, delay line 300 includes tens or hundreds of delay elements 310.

The delay elements 310 are configured to respond to one or more control signals 322 by forming an arrangement by which control line 300 receives an input signal at delay line input 330, returns a first delayed signal having a first delay with respect to the input signal at first delay line output 340, and returns a second delayed signal having a second delay with respect to the input signal at second delay line output 350.

A subset of the delay elements 310 is configured to provide a forward path 370, a first return path 380, and a second return path 390. In operation, an input signal received at delay line input 330 propagates along forward path 370 and first return path 380 and is provided at first delay line output 340 having the first delay. In operation, the input signal received at delay line input 330 propagates along forward path 370 and second return path 390 and is provided at second delay line output 350 having the second delay.

As described in the examples below, because first return path 380 and second return path 390 include differing numbers of multiplexers, the first delay is different from the second delay. In some configurations, first return path 380 includes one more multiplexer than second return path 390, so the first delay is greater than the second delay. In some configurations, first return path 380 includes at least two more multiplexers than second return path 390, so the first delay is greater than the second delay. In some configurations, second return path 390 includes one more multiplexer than first return path 380, so the second delay is greater than the first delay. In some configurations, second return path 390 includes at least two more multiplexers than first return path 380, so the second delay is greater than the first delay.

In some embodiments, each delay element 310 has a same structure, e.g., delay element 100 as described above with respect to FIG. 1 and FIGS. 2A-2E. In some embodiments in which delay elements 310 have the structure of delay element 100, delay line input 330 is coupled to input port 110 of delay element 310[1], first delay line output 340 is coupled to first return path output port 180 of delay element 310[1] and second delay line output 350 is coupled to second return path output port 190 of delay element 310[1].

In the first example configuration of FIG. 3A, in some embodiments, forward path 370 is formed by a combination of input port 110, forward path multiplexer FP, and forward path output port 170 of delay elements 310[1] and 310[2]. In some embodiments, first return path 380 is formed by a combination of input port 130, input port 140, first return path multiplexer R1, and first return path output port 180 of delay elements 310[1] and 310[2]. In some embodiments, second return path 390 is formed by a combination of input port 150, input port 160, second return path multiplexer R2, and second return path output port 190 of delay elements 310[1] and 310[2].

In the first example configuration of FIG. 3A, in some embodiments, delay element 310[1] is configured in the direct mode as described above with respect to FIG. 2A and delay element 310[2] is configured in the full return mode as described above with respect to FIG. 2D to achieve the first example configuration of FIG. 3A. In such embodiments, delay element 310[2] is configured to connect forward path 370 to first return path 380 and to second return path 390.

In some embodiments, delay element 310[1] is configured in the second return mode as described above with respect to FIG. 2B and delay element 310[2] is configured in the first return mode as described above with respect to FIG. 2C to achieve an alternative example configuration (not shown) of delay line 300. In such embodiments, delay element 310[1] is configured to connect forward path 370 to second return path 390 and delay element 310[2] is configured to connect forward path 370 to first return path 380.

Each delay element 310 is coupled to a corresponding header 312 and a corresponding footer 314. Header 312 is configured to switchably couple delay element 310 to a first voltage reference VDD and footer 314 is configured to switchably couple delay element 310 to a second voltage reference VCC. In some embodiments, second voltage reference VCC is a ground reference. In some embodiments, one or both of header 312 or footer 314 includes a low-leakage transistor.

Each of header 312 and footer 314 is configured to respond to one or more control signals 322 to selectively couple delay element 310 to voltage references VDD and VCC. In operation, header 312 and footer 314 function to provide power to delay element 310.

A delay element 310 that is decoupled from VDD and/or VCC has a powered off status and a delay element 310 that is coupled to VDD and VCC has a powered on status. A delay element 310 having the powered on status is capable of responding to received input signals. For example, in FIG. 3A, each of delay elements 310[1] and 310[2] has the powered on status. A delay element 310 having the powered off status is not capable of responding to received input signals and is in a non-controllable state. For example, in FIG. 3A, each of delay elements 310[3], 310[N−1] and 310[N] has the powered off status.

Control unit 320 includes one or more logic circuits configured to provide control signals 322 to delay elements 310, headers 312, and footers 314 via control outputs 324. Control unit 320 is configured to transmit sets of control signals 322 in parallel on control outputs 324 to the plurality of delay elements 310 and to headers 312 and footers 314. In some embodiments, delay line 300 is configured so that one or more of control signals 322 output by control unit 320 on control outputs 324 are received as input signals at control signal inputs FPC, R1C, and R2C of delay elements 310.

In some embodiments, control outputs 324 directly connect control unit 320 to each of delay elements 310. In some embodiments, control outputs 324 connect to delay elements 310 via one or more intermediate circuits. In some embodiments, control outputs 324 connect to delay elements 310 via a data, or control bus.

Control unit 320 includes delay code input 326 configured to receive a delay code 328 corresponding to one or more predetermined delays for an input signal. Control unit 320 is configured to generate one or more sets of control signals 322 based on received delay code 328. The one or more sets of control signals 322 define a configuration of delay line 300 that corresponds to the one or more delays for the input signal. The one or more sets of control signals 322 also define which delay elements 310 have the powered on status and which delay elements 310 have the powered off status.

In some embodiments, control unit 320 is configured to generate one or more sets of control signals 322 using a look-up table. In some embodiments, control unit 320 includes a look-up table and is configured to generate one or more sets of control signals 322 using the look-up table. In some embodiments, a look-up table includes a plurality of sets of control signals 322 and each set of control signals 322 corresponds to delay code 328. In some embodiments, control unit 320 is configured to generate one or more sets of control signals 322 using a thermometer code or another suitable signal generation method.

In the first example depicted in FIG. 3A, delay line 300 has the first configuration corresponding to a first set of control signals 322 provided on control outputs 324. The first set of control signals 322 is generated by control unit 320 and is operable to achieve a first total delay and a second total delay defined by a first delay code 328. The first total delay corresponds to signal propagation along the path from delay line input 330 to first delay line output 340 along forward path 370 and first return path 380. The second total delay corresponds to signal propagation along the path from delay line input 330 to second delay line output 350 along forward path 370 and second return path 390. In some embodiments, the first set of control signals 322 based on the first delay code 328 is one set of control signals 322 of a plurality of sets of control signals 322 based on the first delay code 328.

In the first example depicted in FIG. 3A, each delay element 310[3], 310[N−1], and 310[N] is unused in the signal path and has the powered off status, indicated by an X. In the powered off status, leakage current flowing from a power source through a delay element is significantly reduced compared to leakage current in the powered on state.

In the example depicted in FIG. 3B, delay line 300 has a second configuration. As in the first example depicted in FIG. 3A, delay element 310[1] is configured in the direct mode (FIG. 2A) and delay element 310[2] is configured in the full return mode (FIG. 2D), and delay element 310[N] has the powered off status. In contrast to the first example depicted in FIG. 3A, each of delay elements 310[3] and 310[N−1] has the powered on status and is configured in the initialization mode (FIG. 2E).

In the example depicted in FIG. 3B, delay line 300 has the second configuration corresponding to a second set of control signals 322 provided on control outputs 324. The second set of control signals is generated by control unit 320 based on a second delay code 328 that corresponds to a third total delay longer than the first total delay and a fourth total delay longer than the second total delay. To provide the increased delays, delay line 300, in operation, is reconfigured from the first configuration by using delay elements 310[3] and 310[N−1], which had the powered off status in the first configuration.

The second example configuration of FIG. 3B represents an intermediate step in the reconfiguration of delay line 300 to provide the increased delays, and the third example configuration of FIG. 3C represents the final configuration that provides the increased delays. In the example depicted in FIG. 3C, delay line 300 has the third configuration corresponding to a third set of control signals 322 provided on control outputs 324.

In some embodiments, both the second and third sets of control signals 322 are based on the second delay code 328. In some embodiments, the second set of control signals 322 is based on the second delay code 328, and the third set of control signals 322 is based on a third delay code 328 that defines the third total delay and the fourth total delay.

In the third example configuration of FIG. 3C, the third total delay corresponds to signal propagation along the path from delay line input 330 to first delay line output 340 along forward path 370 and first return path 380. The fourth total delay corresponds to signal propagation along the path from delay line input 330 to second delay line output 350 along forward path 370 and second return path 390. Compared to the configuration of FIG. 3A, the forward and return paths of the configuration of FIG. 3C include additional delay elements. Therefore, the third total delay is longer than the first total delay and the fourth total delay is longer than the second total delay.

In some embodiments, the configuration of FIG. 3C is achieved with each of delay elements 310[1]-310[3] configured in a direct mode (FIG. 2A) and delay element 310[N−1] configured in a full return mode (FIG. 2D). Delay element 310[N] has a powered off status.

In operation, the transition from the first example configuration of FIG. 3A to the second example configuration of FIG. 3B causes the subset of delay elements 310[3] and 310[N−1] to change from the powered off status to the powered on status while configured in the initialization mode. By being powered on in the initialization mode, this subset of delay elements 310 has all path elements grounded as power is applied, thereby quickly discharging any energy stored in a delay element 310 as a result of the previous non-controllable state.

In other approaches in which delay elements are not powered on in the initialization mode, a delay element having a powered off status is capable of having a configuration that causes unpredictable behavior for a period of time after the delay element is powered on. Unpredictable behavior can be caused by uncontrolled charge flow or storage, for example.

Once the reconfiguration to the third example configuration of FIG. 3C is complete, delay line 300 is capable of normal operation without the need for a large recovery time or the performance of additional steps to allow the behavior of newly powered on delay elements to become predictable. Compared to other approaches in which delay elements are not powered on in the initialization mode, the time required to complete the reconfiguration from the first example configuration of FIG. 3A to the third example configuration of FIG. 3C is significantly reduced. The benefit of reducing leakage by powering off unused delay elements is thereby achieved with reduced reconfiguration times in comparison to other approaches.

While the example configurations of FIGS. 3A-3C include five delay elements 310 and a subset of two recently powered on delay elements 310, other embodiments include subsets of greater or fewer recently powered on delay elements 310. In some embodiments, delay line 300 includes subsets of tens or hundreds of recently powered on delay elements 310.

Figure 4:
FIG. 4 is a flow chart of a method of powering on a delay element of a delay line, in accordance with some embodiments.

FIG. 4 is a flow chart of a method 400 of powering on a delay element of a delay line, in accordance with some embodiments. Method 400 is usable in conjunction with a delay line including cascaded delay elements. In some embodiments, method 400 is usable in conjunction with delay line 300, including cascaded delay elements, e.g., delay element 100. In some embodiments, method 400 is usable in conjunction with a delay line including cascaded delay elements 100 having a configuration different from the configuration of delay line 300. The delay line and cascaded delay elements are configurable to apply one or more delays to an input signal.

In operation 402, a delay element of a delay line receives a set of control signals. The set of control signals causes the delay line to have a configuration that differs from a previous configuration of the delay line. In some embodiments, the previous configuration is a powered off state of the delay line. In some embodiments, the previous configuration corresponds to first values of one or more delays of an input signal, and the set of control signals causes the delay line to have a configuration corresponding to second values of the one or more delays of the input signal. In some embodiments, the second values of the one or more delays of the input signal are longer than the first values of the one or more delays of the input signal. In some embodiments, a delay element 100, described above with respect to FIGS. 1-2E, receives a set of control signals. In some embodiments, a delay element 310 of delay line 300 receives a second set of control signals 322, described above with respect to FIGS. 3A-3C.

In operation 404, in response to the set of control signals, the delay element is changed from having a powered off status to having a powered on status, and the delay element is powered on while configured in an initialization mode. In some embodiments, an initialization mode is the initialization mode described above with respect to delay element 100 and FIG. 2E. In some embodiments, a delay element 100, described above with respect to FIGS. 1-2E, is powered on while configured in the initialization mode. In some embodiments, a delay element 310 of delay line 300, described above with respect to FIGS. 3A-3C, is powered on while configured in the initialization mode.

By the execution of method 400, a delay element of a delay line is powered on and configured while avoiding a large recovery time to allow the behavior of the newly powered on delay element to become predictable, thereby realizing the benefits described above with respect to delay line 300. For example, a delay element powered on using method 400 can be quickly configured, in response to a second set of control signals, to transfer a signal to an adjacent delay element of the delay line.

FIG. 5 is a flow chart of a method 500 of powering on a delay element of a plurality of cascaded delay elements, in accordance with some embodiments. Method 500 is usable in conjunction with a delay line including cascaded delay elements. In some embodiments, method 500 is usable in conjunction with delay line 300, including cascaded delay elements, e.g., delay element 100. In some embodiments, method 500 is usable in conjunction with a delay line including cascaded delay elements 100 having a configuration different from the configuration of delay line 300. The delay line and cascaded delay elements are configurable to apply one or more delays to an input signal.

Method 500 is usable in scenarios in which a delay line is either powered on and configured for a first delay or first set of delays or is reconfigured for a second delay that is longer than a first delay or for a second set of delays that are longer than a first set of delays. In each of these scenarios, at least one newly powered on delay element is initialized and quickly usable as part of one or more return paths. In some embodiments, method 500 is used in conjunction with a delay line on which additional operations are performed in which one or more delay elements are also powered down before, between, and/or after the operations of method 500 are performed. For example, in some embodiments, one or more delay elements are powered down as part of reconfiguring a delay line to have a shorter delay than in a previous configuration.

In some embodiments, in operation 502, a control unit receives a first delay code. In some embodiments, control unit 320 of delay line 300 receives a first delay code 328 at delay code input 326, described above with respect to FIGS. 3A-3C. In some embodiments, operation 502 is omitted. For example, operations 502 through 508 are omitted in embodiments where an entire delay line is in a powered off status, in some embodiments.

In some embodiments, method 500 continues at operation 504, in which the control unit generates a first set of control signals. In some embodiments, control unit 320 of delay line 300 generates a first set of control signals 322, described above with respect to FIGS. 3A-3C. In some embodiments, the control unit generates the first set of control signals based on the first delay code. In some embodiments, the control unit generates the first set of control signals using a look-up table. In some embodiments, the control unit includes a look-up table and using a look-up table includes using the look-up table in the control unit. In some embodiments, the first set of control signals is one of a plurality of sets of control signals in a look-up table, and the control unit generates the first set of control signals by matching the first delay code to the first set of control signals.

In some embodiments, the control unit generates the first set of control signals using a thermometer code or another suitable signal generation method. In embodiments in which operation 504 is included, the control unit sends the first set of control signals to the plurality of cascaded delay elements. In some embodiments, control unit 320 of delay line 300 sends the first set of control signals 322 to delay elements 310 via control outputs 324, described above with respect to FIGS. 3A-3C.

In some embodiments, method 500 continues at operation 506, in which, based on the first set of control signals, the plurality of cascaded delay elements is set in a first configuration to receive an input signal on a forward path and return the input signal on two return paths. In some embodiments, based on the first set of control signals 322 received via control outputs 324, delay elements 310 of delay line 300 are set in a first configuration to receive an input signal on forward path 370 and return the input signal on return paths 380 and 390, described above with respect to FIG. 3A.

In some embodiments, the plurality of cascaded delay elements is set in the first configuration by setting a first delay element of the plurality of cascaded delay elements to return the input signal along the two return paths. In some embodiments, delay elements 310 of delay line 300 are set in the first configuration by setting delay element 310[1] in a direct mode and delay element 310[2] in a full return mode as described above with respect to FIGS. 2A, 2D, and 3A.

In some embodiments, the plurality of cascaded delay elements is set in the first configuration by setting a first delay element of the plurality of cascaded delay elements to return the input signal along a first of the two return paths and setting a second delay element of the plurality of cascaded delay elements to return the input signal along a second of the two return paths. In some embodiments, delay elements 310 of delay line 300 are set in the first configuration by setting delay element 310[1] in a second return mode and delay element 310[2] in a first return mode as described above with respect to FIGS. 2B, 2C, and 3A.

In some embodiments, method 500 continues at operation 508, in which a first signal is propagated on the forward path and a return path of the two return paths, the propagation occurring with the first configuration and having a first delay. In some embodiments, a first signal is propagated on forward path 370 and at least one of return path 380 or return path 390 of delay line 300, configured as described above with respect to FIG. 3A.

In some embodiments, operation 508 is omitted. For example, operation 508 is omitted when a requested delay is changed prior to supplying an input signal to the delay line, in some embodiments. The first delay is defined by the first delay code which defines a manner in which the input signal propagates through the plurality of cascaded delay elements.

In some embodiments, method 500 continues at operation 510, in which the control unit receives a second delay code. In some embodiments, control unit 320 of delay line 300 receives a second delay code 328 at delay code input 326, described above with respect to FIGS. 3A-23C. In some embodiments, operation 510 is omitted. For example, operation 510 is omitted when the delay line maintains the first delay, in some embodiments. In some embodiments in which operations 502 through 508 are omitted, the second delay code is an only delay code received by the control unit.

Method 500 continues at operation 512, in which the control unit generates a second set of control signals. In some embodiments, control unit 320 of delay line 300 generates a second set of control signals 322, described above with respect to FIGS. 3A-3C. In some embodiments in which method 500 does not include one or more of operations 502-508, the second set of control signals is not preceded by a first set of control signals.

In some embodiments, the control unit generates the second set of control signals based on the second delay code. In some embodiments, the control unit generates the second set of control signals 322 based on the second delay code 328, described above with respect to FIGS. 3-5. In some embodiments, the control unit generates the second set of control signals using a look-up table. In some embodiments, the control unit includes a look-up table and using a look-up table includes using the look-up table in the control unit. In some embodiments, the second set of control signals is one of a plurality of sets of control signals in a look-up table, and the control unit generates the second set of control signals by matching the second delay code to the second set of control signals.

In some embodiments, the control unit generates the second set of control signals using a thermometer code or another suitable signal generation method. In some embodiments, the second set of control signals is generated using a same process as that for generating the first set of control signals. In some embodiments, the second set of control signals is generated using a different process from that for generating the first set of control signals.

The control unit sends the second set of control signals to the plurality of cascaded delay elements. In some embodiments, the control unit sends the second set of control signals to the plurality of cascaded delay elements in parallel, i.e., simultaneously. In some embodiments, control unit 320 of delay line 300 sends the second set of control signals 322 to delay elements 310 via control outputs 324, described above with respect to FIGS. 3A-3C.

Method 500 continues at operation 514, in which, based on the second set of control signals, a delay element of the plurality of cascaded delay elements is initialized. In some embodiments, delay element 310[3] of delay line 300 is initialized based on the second set of control signals 322 as described above with respect to FIG. 3B.

In some embodiments, the initialized delay element is one of multiple delay elements of the plurality of cascaded delay elements, and initializing the delay element includes initializing all of the multiple delay elements. In some embodiments, delay elements 310[3] and 310[N−1] of delay line 300 are multiple delay elements, and initializing the delay element includes initializing both delay element 310[3] and delay element 310[N−1] based on the second set of control signals 322 as described above with respect to FIG. 3B.

In some embodiments, the initialized delay element is a delay element that was not previously powered on because the entire delay line was not powered on. In some embodiments, the initialized delay element is a delay element that was not previously powered on because the delay element was not used in the first configuration, the first configuration corresponding to a first delay shorter than a second delay corresponding to the second set of control signals.

Initializing the delay element includes powering on the delay element after grounding a forward path output of the delay element, configuring a first return path output to receive a first forward path input signal, and configuring a second return path output to receive a second forward path input signal. In some embodiments, initializing the delay element includes powering on delay element 100 in the initialization mode described above with respect to FIG. 2E.

In some embodiments, grounding the forward path output of the delay element includes configuring a forward path multiplexer to select a first input coupled to a ground reference instead of a second input configured to receive a forward path output signal of a first adjacent delay element or the input signal of the delay circuit. In some embodiments, grounding the forward path output of the delay element includes configuring forward path multiplexer FP of delay element 100 to select the signal received at input port 120, described above with respect to FIG. 2E.

In some embodiments, configuring the first return path output to receive the first forward path input signal includes configuring a first return path multiplexer to select a first input instead of a second input. The first input is coupled to a forward path output of a delay element adjacent to the initialized delay element in the direction from which the signal is propagated. The second input is coupled to a first return path output of a delay element adjacent to the initialized delay element in the opposite direction. In some embodiments, configuring the first return path output to receive the first forward path input signal includes configuring first return path multiplexer R1 of delay element 100 to select the signal at input port 130, described above with respect to FIG. 2E.

In some embodiments, configuring the second return path output to receive the second forward path input signal includes configuring a second return path multiplexer to select a first input instead of a second input. The first input is coupled to a forward path output of a delay element adjacent to the initialized delay element in the direction from which the signal is propagated. The second input is coupled to a first return path output of a delay element adjacent to the initialized delay element in the opposite direction. In some embodiments, configuring the second return path output to receive the second forward path input signal includes configuring second return path multiplexer R2 of delay element 100 to select the signal at input port 150, described above with respect to FIG. 2E.

Method 500 continues at operation 516, in which the control unit generates a third set of control signals. In some embodiments, control unit 320 of delay line 300 generates a third set of control signals 322, described above with respect to FIGS. 3A-3C. In some embodiments in which method 500 does not include one or more of operations 502-508, the third set of control signals is preceded by only the second set of control signals.

In some embodiments, the control unit generates the third set of control signals based on the second delay code. In some embodiments, the control unit generates the third set of control signals 322 based on the second delay code 328, described above with respect to FIGS. 3A-3C. In some embodiments, the control unit generates the third set of control signals using a look-up table. In some embodiments, the control unit includes a look-up table and using a look-up table includes using the look-up table in the control unit. In some embodiments, the third set of control signals is one of a plurality of sets of control signals in a look-up table, and the control unit generates the third set of control signals by matching the second delay code to the third set of control signals.

In some embodiments, the control unit generates the third set of control signals using a thermometer code or another suitable signal generation method. In some embodiments, the third set of control signals is generated using a same process as that for generating at least one of the first set of control signals or the second set of control signals. In some embodiments, the third set of control signals is generated using a different process from that for generating at least one of the first set of control signals or the second set of control signals.

The control unit sends the third set of control signals to the plurality of cascaded delay elements. In some embodiments, control unit 320 of delay line 300 sends the third set of control signals 322 to delay elements 310 via control outputs 324, described above with respect to FIGS. 3A-3C. In some embodiments, the control unit sends the third set of control signals to the plurality of cascaded delay elements in parallel, i.e., simultaneously.

Method 500 continues at operation 518, in which, based on the third set of control signals, the plurality of cascaded delay elements is set in a second configuration to receive an input signal on the forward path and return the input signal on the two return paths. In some embodiments, based on the third set of control signals 322 received via control outputs 324, delay elements 310 of delay line 300 are set in a second configuration to receive an input signal on forward path 370 and return the input signal on return paths 380 and 390, described above with respect to FIG. 3C.

Setting the plurality of cascaded delay elements in the second configuration includes configuring the delay element to transfer a signal to an adjacent delay element of the plurality of cascaded delay elements. In some embodiments, setting the plurality of cascaded delay elements in the second configuration includes configuring delay element 310[3] of delay line 300 to transfer a signal to delay element 310[N−1] of delay line 300 as described above with respect to FIG. 3C.

In some embodiments, the delay element is one of multiple delay elements of the plurality of cascaded delay elements, and setting the delay element includes setting each of the multiple delay elements to transfer a signal to an adjacent delay element of the plurality of cascaded delay elements. In some embodiments in which operations 502 through 508 are omitted, the second configuration is an only configuration of the plurality of cascaded delay elements.

In some embodiments, method 500 continues at operation 520, in which the method propagates a second input signal on the forward path and on the return path of the two return paths, the propagation occurring with the second configuration and having a second delay. In some embodiments, a second signal is propagated on forward path 370 and at least one of return path 380 or return path 390 of delay line 300, configured as described above with respect to FIG. 3C.

Propagating the second input signal on the forward path and on the return path of the two return paths includes propagating the second signal using the delay element configured to transfer the signal to the adjacent delay element of the plurality of cascaded delay elements. In some embodiments, propagating a second signal on forward path 370 and at least one of return path 380 or return path 390 of delay line 300 includes propagating the second signal using delay element 310[3], configured as described above with respect to FIG. 3C.

In some embodiments, operation 520 is omitted. For example, operation 520 is omitted when a requested delay is changed prior to supplying a second input signal to the delay line, in some embodiments. The second delay is defined by the second delay code which defines a manner in which the second input signal propagates through the plurality of cascaded delay elements.

By the execution of method 500, a delay element of a delay line is powered on and configured while avoiding a large recovery time to allow the behavior of the newly powered on delay element to become predictable, thereby realizing the benefits described above with respect to delay line 300.

Figure 6:
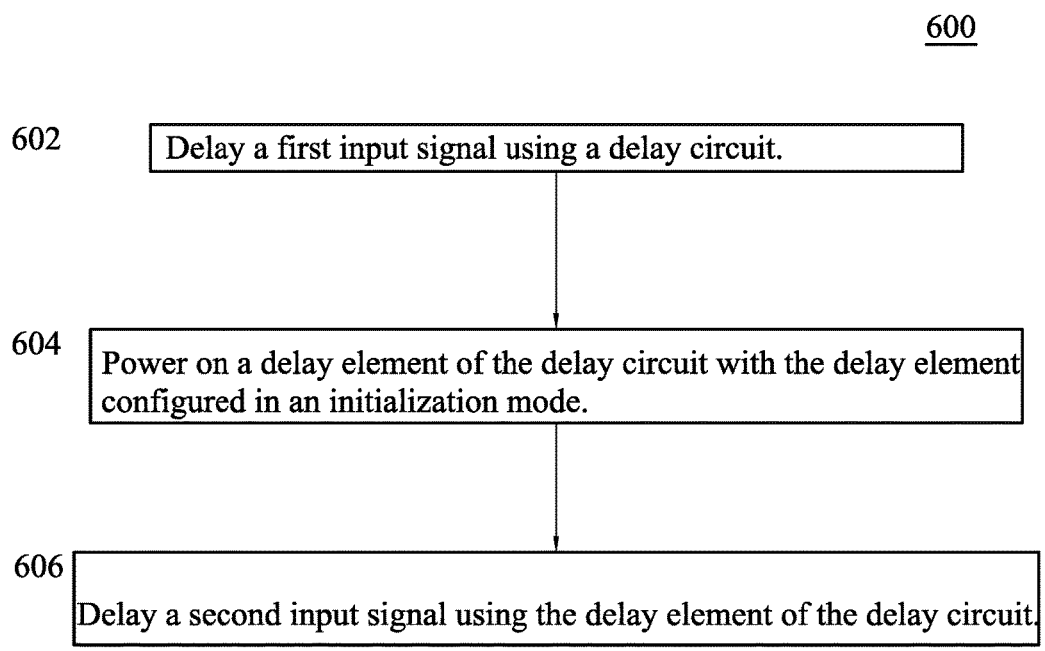
FIG. 6 is a flow chart of a method of operating a delay circuit, in accordance with some embodiments.

FIG. 6 is a flow chart of a method 600 of operating a delay circuit, in accordance with some embodiments. The method 600 is usable in conjunction with a delay line including cascaded delay elements. In some embodiments, method 600 is usable in conjunction with delay line 300, comprising cascaded delay elements, e.g. delay element 100. In some embodiments, method 600 is usable in conjunction with a delay line including cascaded delay elements 100 having a configuration different from the configuration of delay line 300.

At operation 602, a first input signal is delayed by a first delay using a delay circuit. In some embodiments, a first input signal is delayed by a first delay using delay line 300, described above with respect to FIGS. 3A-3C.

At operation 604, a delay element of the delay circuit is powered on while configured in an initialization mode. In some embodiments, an initialization mode is the initialization mode described above with respect to delay element 100 and FIG. 2E. In some embodiments, a delay element 310 of delay line 300, described above with respect to FIGS. 3A-3C, is powered on while configure in the initialization mode.

At operation 606, a second input signal is delayed by a second delay using the delay element of the delay circuit. In some embodiments, the second delay is longer than the first delay. In some embodiments, the second input signal is delayed by the second delay using delay line 300, described above with respect to FIGS. 3A-3C.

By the execution of method 600, a delay circuit delays a first signal, powers on a delay element, and delays a second signal using the delay element while avoiding a large recovery time to allow the behavior of the newly powered on delay element to become predictable, thereby realizing the benefits described above with respect to delay line 300.

Figure 7:
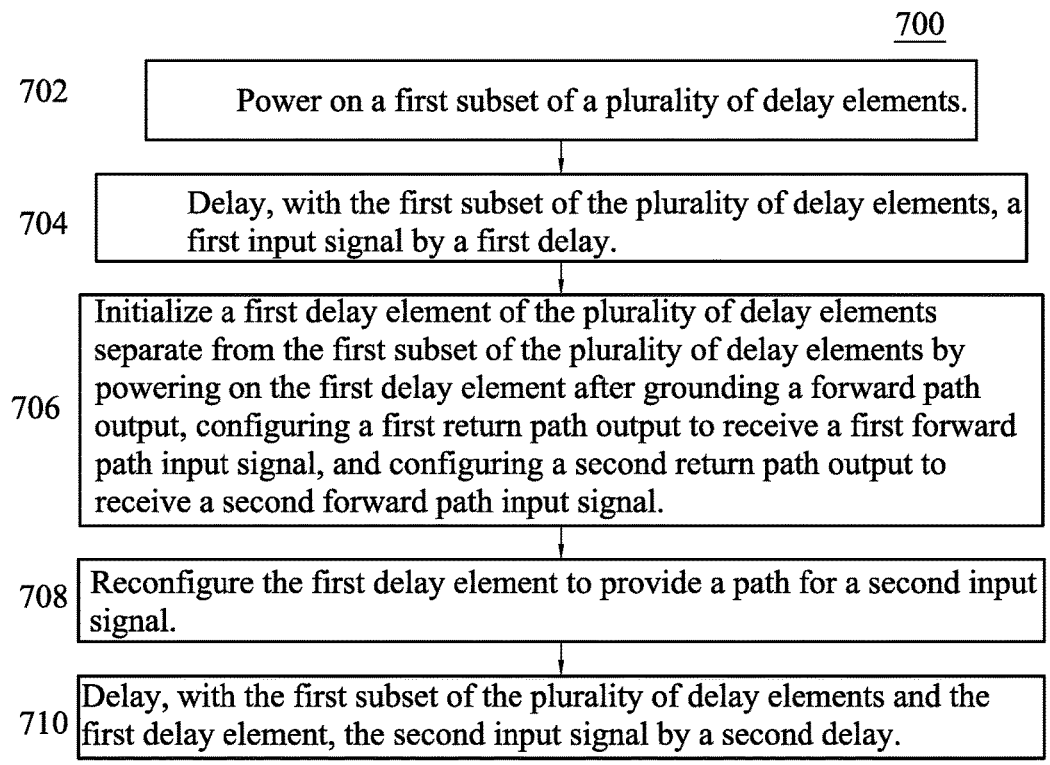
FIG. 7 is a flow chart of a method of operating a delay circuit, in accordance with some embodiments.

FIG. 7 is a flow chart of a method 700 of operating a delay circuit, in accordance with some embodiments. Method 700 is usable in conjunction with a delay line including cascaded delay elements. In some embodiments, method 700 is usable in conjunction with delay line 300, comprising cascaded delay elements, e.g. delay element 100. In some embodiments, method 700 is usable in conjunction with a delay line including cascaded delay elements 100 having a configuration different from the configuration of delay line 300.

Method 700 is usable in scenarios in which a delay line is reconfigured for a second delay that is longer than a first delay. In each of these scenarios, at least one newly powered on delay element is initialized and quickly usable as part of one or more return paths. In some embodiments, method 700 is used in conjunction with a delay line on which additional operations are performed in which one or more delay elements are also powered down before, between, and/or after the operations of method 700 are performed. For example, in some embodiments, one or more delay elements are powered down as part of reconfiguring a delay line to have a shorter delay than in a previous configuration.

At operation 702, a first subset of a plurality of delay elements is powered on. In some embodiments, delay elements 310[1] and 310[2] are a first subset of delay elements 310 of delay line 300 and are powered on as described above with respect to FIG. 3A.

Method 700 continues at operation 704, in which the first subset of the plurality of delay elements delays a first input signal by a first delay. In some embodiments, delay elements 310[1] and 310[2] delay an input signal received at delay line input 330 of delay line 300 by a first delay as described above with respect to FIG. 3A.

Method 700 continues at operation 706, in which a first delay element of the plurality of delay elements is initialized. The first delay element is separate from the first subset of the plurality of delay elements. In some embodiments, a first delay element 310[3] of delay elements 310 of delay line 300 is initialized as described above with respect to FIG. 3B.

Initializing the first delay element includes powering on the first delay element after grounding a forward path output of the first delay element, configuring a first return path output to receive a first forward path input signal, and configuring a second return path output to receive a second forward path input signal. In some embodiments, initializing the delay element includes powering on the delay element 100 in the initialization mode described above with respect to FIG. 2E.

In some embodiments, the first delay element is part of a second subset of delay elements, and initializing first delay element includes initializing each delay element of the second subset of delay elements. In some embodiments, delay elements 310[3] and 310[N−1] of delay line 300 are part of a second subset of delay elements, and initializing the first delay element includes initializing both delay element 310[3] and delay element 310[N−1] as described above with respect to FIG. 3B.

In some embodiments, the first delay element is part of a second subset of delay elements, and the second subset of delay elements is initialized in parallel. In some embodiments, delay elements 310[3] and 310[N−1] of delay line 300 are part of a second subset of delay elements, and initializing the first delay element includes initializing delay element 310[3] and delay element 310[N−1] in parallel as described above with respect to FIG. 3B.

Method 700 continues at operation 708, in which the first delay element is reconfigured to provide a path for a second input signal. In some embodiments, first delay element 310[3] of delay elements 310 of delay line 300 is reconfigured as described above with respect to FIG. 3C. In some embodiments, first delay element 310[3] and delay element 310[N−1] of delay elements 310 of delay line 300 are reconfigured as described above with respect to FIG. 3C.

Method 700 continues at operation 710, in which the first subset of the plurality of delay elements and the first delay element delay the second input signal by a second delay. The second delay is different from the first delay. In some embodiments, the second delay is shorter than the first delay. In some embodiments, the second delay is longer than the first delay.

In some embodiments, delay elements 310[1], 310[2], and 310[3] delay an input signal received at delay line input 330 of delay line 300 by a second delay as described above with respect to FIG. 3C. In some embodiments, delay elements 310[1]-310[N−1] delay an input signal received at delay line input 330 of delay line 300 by a second delay as described above with respect to FIG. 3C.

By the execution of method 700, a delay circuit delays a first signal, powers on a delay element, and delays a second signal using the delay element while avoiding a large recovery time to allow the behavior of the newly powered on delay element to become predictable, thereby realizing the benefits described above with respect to delay line 300.

One aspect of this description relates to a delay circuit. The delay circuit includes a plurality of cascaded delay elements responsive to control signals. Each delay element is configurable to receive an input signal on a forward path and return the input signal on two return paths. The delay circuit also includes a control unit connected to the plurality of cascaded delay elements and configured to generate a first set of control signals of the control signals for defining a first configuration of the plurality of cascaded delay elements, generate a second set of control signals of the control signals for causing a delay element of the plurality of cascaded delay elements to change from a powered off status to a powered on status while configured in an initialization mode, and generate a third set of control signals of the control signals for defining a second configuration of the plurality of cascaded delay elements.

Another aspect of this description relates to a method of powering on a delay element of a plurality of cascaded delay elements by generating, by a control unit, a first set of control signals, and, based on the first set of control signals, initializing the delay element by connecting the delay element to at least one power source, grounding a forward path output of the delay element, configuring a first return path output to receive a first forward path input signal, and configuring a second return path output to receive a second forward path input signal. The method also includes generating a second set of control signals and, based on the second set of control signals, configuring the delay element to transfer a signal to an adjacent delay element of the plurality of delay elements.

Still another aspect of this description relates to a method of operating a delay circuit by powering on a first subset of a plurality of delay elements, delaying, with the first subset of the plurality of delay elements, a first input signal by a first delay, and initializing a first delay element of the plurality of delay elements, the first delay element being separate from the subset of delay elements. Initializing the first delay element includes powering on the first delay element, grounding a forward path output of the first delay element, configuring a first return path output to receive a first forward path input signal, and configuring a second return path output to receive a second forward path input signal. The method also includes reconfiguring the first delay element to provide a path for a second input signal, and delaying, with the first subset of the plurality of delay elements and the first delay element, the second input signal by a second delay.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A delay circuit, comprising:
   a plurality of cascaded delay elements responsive to control signals, wherein each delay element of the plurality of cascaded delay elements is configurable to receive an input signal on a forward path and return the input signal on two return paths; and
   a control unit connected to the plurality of cascaded delay elements, wherein the control unit is configured to:
      generate a first set of control signals of the control signals for defining a first configuration of the plurality of cascaded delay elements;
      generate a second set of control signals of the control signals for causing a delay element of the plurality of cascaded delay elements to change from a powered off status to a powered on status while the delay element is configured in an initialization mode; and
      generate a third set of control signals of the control signals for defining a second configuration of the plurality of cascaded delay elements,
   wherein
      the powered off status of the delay element comprises the delay element being decoupled from a power source, and
      the powered on status of the delay element comprises the delay element being coupled to the power source.

2. The delay circuit of claim 1, wherein each delay element of the plurality of cascaded delay elements comprises:
   a forward path multiplexer comprising a first input port configured to receive a forward path output signal of a first adjacent delay element or the input signal of the delay circuit, a second input port coupled to a ground reference, and a forward path output port;
   a first return path multiplexer comprising a third input port coupled to the first input port of the forward path multiplexer, a fourth input port configured to receive a first return path output signal of a second adjacent delay element, and a first return path output port; and
   a second return path multiplexer comprising a fifth input port coupled to the forward path output port of the forward path multiplexer, a sixth input port configured to receive a second return path output signal of the second adjacent delay element, and a second return path output port.

3. The delay circuit of claim 2, wherein the forward path multiplexer is configured to output the ground reference in the initialization mode.

4. The delay circuit of claim 2, wherein the first return path multiplexer is configured to output the forward path output signal of the first adjacent delay element at the third input port and the second return path multiplexer is configured to output an output signal of the forward path multiplexer at the fifth input port in the initialization mode.

5. The delay circuit of claim 1, wherein:
   the delay element is one delay element of a subset of the plurality of cascaded delay elements, the second set of control signals is usable to cause each delay element of the subset of the plurality of cascaded delay elements to change from the powered off status to the powered on status, and the control unit is further configured to send the second set of control signals to the subset of the plurality of cascaded delay elements in parallel.

6. The delay circuit of claim 5, wherein the control unit is further configured to transmit the third set of control signals to the subset of the plurality of cascaded delay elements in parallel.

7. The delay circuit of claim 1, wherein:
the first configuration of the plurality of cascaded delay elements prevents the input signal from propagating to the delay element in the forward path or the two return paths, and
the second configuration of the plurality of cascaded delay elements includes the delay element in at least one of the forward path or the two return paths.

8. The delay circuit of claim 1, wherein each delay element of the plurality of cascaded delay elements comprises at least one of a header circuit or a footer circuit responsive to the control signals to selectively couple a corresponding delay element of the plurality of cascaded delay elements to the power source in accordance with a powered on or powered off status of the corresponding delay element of the plurality of cascaded delay elements.

9. The delay circuit of claim 1, wherein the control unit is further configured to:
receive a delay code defining a delay for the input signal; and
in response to the delay code, determine the second set of control signals and the third set of control signals.

10. A method of powering on a delay element of a plurality of cascaded delay elements, the method comprising:
generating a first set of control signals using a control unit;
based on the first set of control signals, initializing the delay element by:
connecting the delay element to at least one power source;
grounding a forward path output of the delay element;
configuring a first return path output to receive a first forward path input signal; and
configuring a second return path output to receive a second forward path input signal;
generating a second set of control signals; and
based on the second set of control signals, configuring the delay element to transfer a signal to an adjacent delay element of the plurality of cascaded delay elements.

11. The method of claim 10, wherein grounding the forward path output of the delay element comprises configuring a forward path multiplexer to select a first input coupled to a ground reference instead of a second input configured to receive the signal from the adjacent delay element.

12. The method of claim 10, wherein configuring the first return path output to receive the first forward path input signal comprises configuring a first return path multiplexer to select a first input coupled to a forward path output of a first adjacent delay element instead of a second input configured to receive a first return path output signal of a second adjacent delay element.

13. The method of claim 10, wherein configuring the second return path output to receive the second forward path input signal comprises configuring a second return path multiplexer to select a first input coupled to a forward path output of the delay element instead of a second input configured to receive a second return path output signal of the adjacent delay element.

14. The method of claim 10, further comprising:
receiving, by the control unit, a delay code; and
generating the first set of control signals and the second set of control signals based on the delay code.

15. The method of claim 10, wherein the delay element is one delay element of a subset of the plurality of cascaded delay elements, the method further comprising sending, by the control unit, the first set of control signals to the subset of the plurality of cascaded delay elements in parallel.

16. The method of claim 15, further comprising initializing each delay element of the subset of the plurality of cascaded delay elements.

17. The method of claim 10, further comprising:
propagating the signal on a forward path and a return path of the plurality of cascaded delay elements, the propagation occurring with the delay element configured to transfer the signal to the adjacent delay element of the plurality of cascaded delay elements.

18. A method of operating a delay circuit, the method comprising:
powering on a first subset of a plurality of delay elements;
delaying, with the first subset of the plurality of delay elements, a first input signal by a first delay;
initializing a first delay element of the plurality of delay elements, the first delay element being separate from the first subset of the plurality of delay elements, initializing the first delay element comprising:
powering on the first delay element;
grounding a forward path output of the first delay element;
configuring a first return path output to receive a first forward path input signal; and
configuring a second return path output to receive a second forward path input signal;
reconfiguring the first delay element to provide a path for a second input signal; and
delaying, with the first subset of the plurality of delay elements and the first delay element, the second input signal by a second delay.

19. The method of claim 18, wherein the second delay is longer than the first delay.

20. The method of claim 18, wherein the first delay element is part of a second subset of delay elements, and the delay elements of the second subset of delay elements are initialized in parallel.

* * * * *